(12) United States Patent
Park

(10) Patent No.: US 8,191,249 B2
(45) Date of Patent: Jun. 5, 2012

(54) METHOD OF MANUFACTURING A PRINTED CIRCUIT BOARD

(75) Inventor: Se Won Park, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 460 days.

(21) Appl. No.: 12/382,057

(22) Filed: Mar. 6, 2009

(65) Prior Publication Data

US 2010/0126761 A1   May 27, 2010

(30) Foreign Application Priority Data

Nov. 26, 2008   (KR) .................. 10-2008-0118187

(51) Int. Cl.
*H01K 3/10* (2006.01)

(52) U.S. Cl. .............. 29/852; 29/830; 29/832; 29/840; 216/13

(58) Field of Classification Search .......... 29/825, 29/830, 832, 840, 852; 216/13
See application file for complete search history.

(56) References Cited

U.S. PATENT DOCUMENTS

| | | | |
|---|---|---|---|
| 5,480,048 A * | 1/1996 | Kitamura et al. ............. | 216/13 |
| 6,791,178 B2 * | 9/2004 | Yamaguchi et al. ........... | 257/699 |
| 7,223,652 B2 * | 5/2007 | Ooi et al. ...................... | 438/238 |
| 7,602,053 B2 * | 10/2009 | Huang et al. .................. | 257/676 |
| 2001/0013425 A1 * | 8/2001 | Rokugawa et al. ........... | 174/262 |
| 2008/0176035 A1 | 7/2008 | Shih et al. | |

FOREIGN PATENT DOCUMENTS

| | | |
|---|---|---|
| JP | 8-186119 | 7/1996 |
| JP | 2000-261141 | 9/2000 |
| JP | 2002-111174 | 4/2002 |
| JP | 2007-311484 | 11/2007 |

OTHER PUBLICATIONS

Japanese Office Action issued Nov. 24, 2010 in corresponding Japanese Patent Application 2009-049575.

Korean Office Action mailed Aug. 11, 2010 and issued in corresponding Korean Patent Application No. 10-2008-0118187.

* cited by examiner

*Primary Examiner* — Carl Arbes

(57) ABSTRACT

Disclosed herein is a method of manufacturing a printed circuit board having a buried pattern, including: forming a second insulation layer on a first insulation layer, the second insulation layer having openings for forming a circuit layer; and filling the openings with a conductive metal to form a circuit layer.

6 Claims, 5 Drawing Sheets

METHOD OF MANUFACTURING A PRINTED CIRCUIT BOARD

CROSS REFERENCE TO RELATED APPLICATION

This application claims the benefit of Korean Patent Application No. 10-2008-0118187, filed Nov. 26, 2008, entitled "a printed circuit board comprising a buried-pattern and a method of manufacturing the same", which is hereby incorporated by reference in its entirety into this application.

BACKGROUND OF THE INVENTION

1. Field of the Invention

The present invention relates to a printed circuit board having a buried pattern and a method of manufacturing the same.

2. Description of the Related Art

A printed circuit board (PCB) serves to electrically connect electronic parts to each other, supply power and mechanically fix them thereon through a wire pattern formed on an insulation substrate made of a phenol resin, an epoxy resin or the like. Such a printed circuit board includes a one-sided printed circuit board, in which a wiring pattern is formed on only one side of an insulation substrate, a double-sided printed circuit board, in which wiring patterns are formed on both sides of an insulation substrate, and a multi-layered printed circuit board (MLB), in which wiring patterns are provided in multiple layers.

As a method of forming a wiring pattern on a printed circuit board, an additive process, a subtractive process, a semi additive process (SAP), a modified semi additive process (MSAP) or the like is used.

Recently, with the advancement of the electronics industry, electronic parts are increasingly required to be highly functionalized and to be miniaturized. In response to the trend, printed circuit boards loaded with such electronic parts are also required to have a highly densified circuit pattern. Thus, methods of realizing various fine circuit patterns are developed, proposed and applied.

In the present invention, among the methods of forming a fine circuit pattern, a method of realizing the densification of a circuit pattern by burying a circuit pattern in an insulation layer will be described.

FIG. 1 shows a conventional process of forming a wiring pattern using MSAP or SAP.

First, as shown in FIG. 1A, a seed layer 3 is formed on an insulation substrate 1, and then a plating resist layer 5 is formed on the seed layer 3. Thereafter, an electroplating layer is formed on the seed layer 3 through an electroplating process. Subsequently, as shown in FIG. 1B, the plating resist layer 5 is removed from the seed layer 3, and then, as shown in FIG. 1C, the exposed portion of the seed layer 3 is removed from the insulation substrate 1 through flash etching or quick etching to form a wiring pattern 7.

However, when the exposed portion of the seed layer 3 is removed from the insulation substrate 1 through flash etching or quick etching, the electroplating layer for forming the wiring pattern is also etched, so that the lateral face of the wiring pattern 7 is greatly tapered and the width of the wiring pattern 7 is decreased, with the result that the wiring pattern 7 is short-circuited and the signal transfer characteristics of the wiring pattern 7 are weakened.

SUMMARY OF THE INVENTION

Accordingly, the present invention has been made keeping in mind the above problems occurring in the prior art, and the present invention provides a printed circuit board in which a circuit pattern is buried in an insulation layer and thus an undercut phenomenon does not occur and which can realize various fine circuit patterns, and a method of manufacturing the same.

An aspect of the present invention provides a method of manufacturing a printed circuit board having a buried pattern, including: forming a second insulation layer on a first insulation layer, the second insulation layer having openings for forming a circuit layer; and filling the openings with a conductive metal to form a circuit layer.

In the method, the forming of the second insulation layer may include: applying a dry film on the first insulation layer; forming grooves on the dry film such that the dry film has the same pattern as the circuit layer; filling the grooves with a second insulation material; and removing the dry film.

Further, the first insulation layer may have higher filler content than the second insulation layer.

Further, the method may further include: forming a via hole passing through the first insulation layer and the second insulation layer after the forming of the second insulation layer, wherein, in the filling of the openings, the via hole as well as the openings is filled with a conductive metal.

Further, the dry film may be a photosensitive dry film.

Further, the method may further include: removing the second insulation material applied on the dry film such that an upper surface of the dry film is exposed, after the filling the grooves with the second insulation material.

Furthermore, the removing of the second insulation material may be conducted by a chemical etching process or a mechanical grinding process.

Another aspect of the present invention provides a printed circuit board having a buried pattern, including: a first insulation layer; a second insulation layer which is formed on the first insulation layer and has openings for forming a circuit layer; and a circuit layer charged in the openings and made of a conductive metal, wherein an interface is formed between the first insulation layer and the second insulation layer.

In the printed circuit board, the first insulation layer may have higher filler content than the second insulation layer.

Further, the printed circuit board may further include: a via made of a conductive metal passing through the first insulation layer and the second insulation layer.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1A:
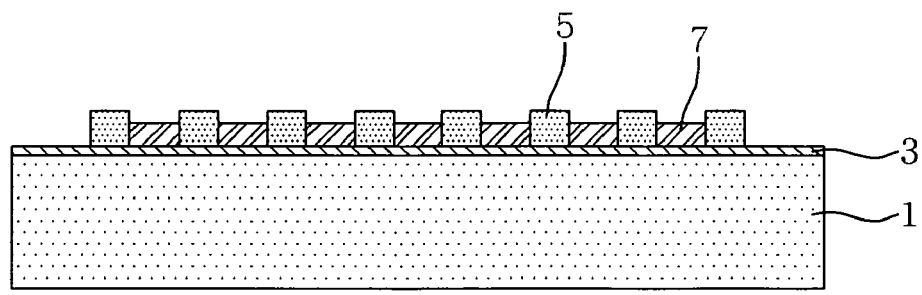
FIG. 1A to 1C are sectional views showing a convention method of manufacturing a printed circuit board.
Figure 1B:
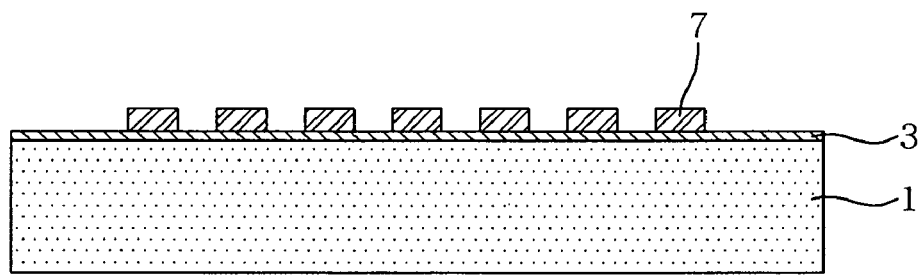
Figure 1C:
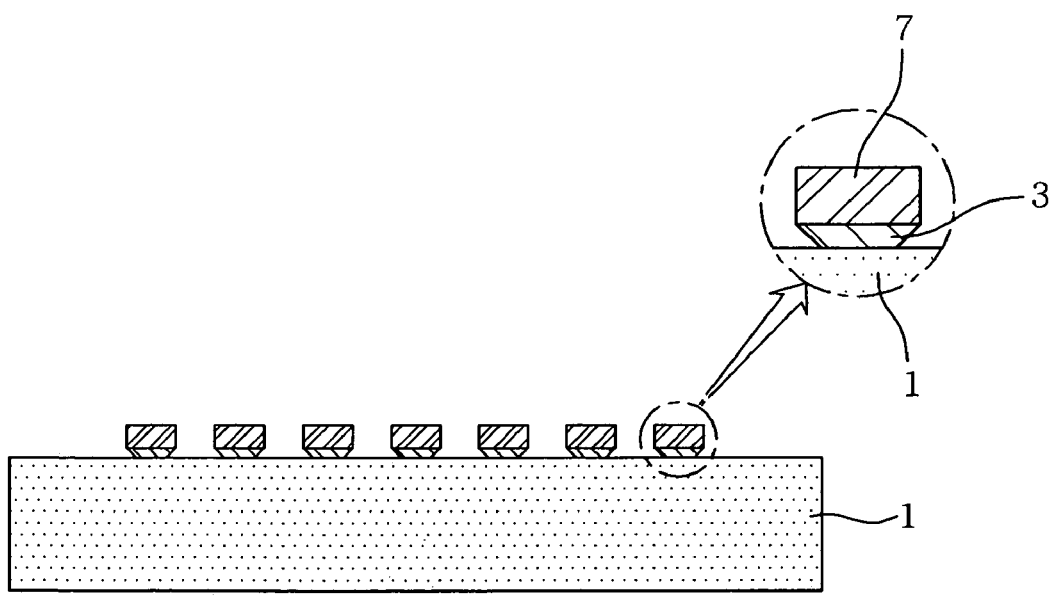

Hereinafter, preferred embodiments of the present invention will be described in detail with reference to the attached drawings.

Throughout the accompanying drawings, the same reference numerals are used to designate the same or similar components, and redundant descriptions thereof are omitted. In the following description, the terms "upper", "lower" and the like are used to differentiate a certain component from other components, but the configuration of such components should not be construed to be limited by the terms.

FIGS. 2 to 8 are sectional views showing a method of manufacturing a printed circuit board having a buried pattern according to an embodiment of the present invention.

Figure 2:
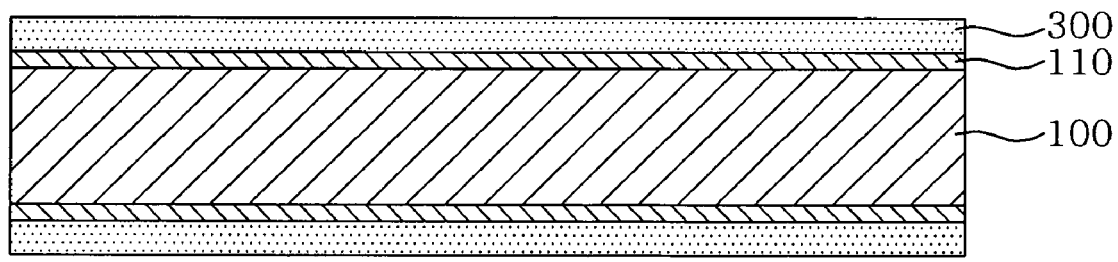
FIGS. 2 to 8 are sectional views showing a method of manufacturing a printed circuit board having a buried pattern according to an embodiment of the present invention.

First, as shown in FIG. 2, a double-side copper clad laminate (CCL), which is used as a core, is provided. The double-side copper clad laminate (CCL) includes an insulation substrate 100, and copper foils 110 applied on both sides of the insulation substrate 100. A first insulation layer 300 is formed on each of the copper foils 110 by applying a first insulating material on each of the copper foils 110. The first insulation layer is made of a polymer material, which is an electric insulator, for example, prepreg including an epoxy resin.

In an embodiment of the present invention, the double-sided copper clad laminate is used as a core substrate, but the present invention is not limited thereto. One-sided, double-sided or multi-layered printed circuit board having a wiring pattern made of conductive metals may be used as a core substrate, and the first insulation layer 300 itself may also be used as a core substrate.

Figure 3:
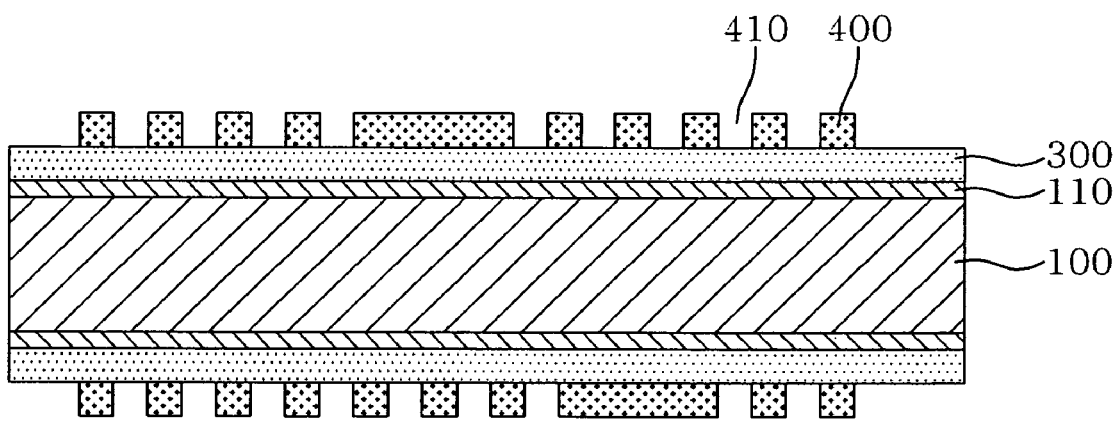

Subsequently, as shown in FIG. 3, a dry film 400 having the same pattern as a circuit layer 900 is formed on the first insulation layer 300. In this case, the dry film 400 may be a photosensitive dry film. The photosensitive dry film is a material which can be patterned by selectively curing it using a mask having light shielding patterns. The dry film 400 formed on the first insulation layer 300 is exposed and developed using a light shielding mask such that the dry film 400 has the same pattern as the circuit layer 900, thereby forming grooves 410 in the dry film 400.

In this case, since the height of a circuit pattern 910 of the circuit layer 900, which is to be formed later, can be adjusted, it is preferred that the thickness of the dry film be thin in order to manufacture a high-density thin printed circuit board.

Figure 4:
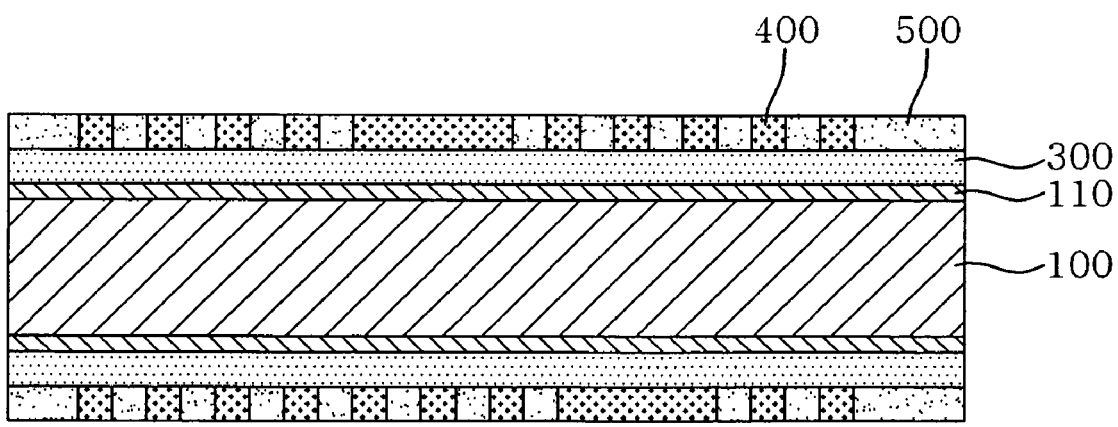

Subsequently, as shown in FIG. 4, a second insulating layer 500 is formed on the first insulation layer 300 by filling the grooves 410 formed in the dry film 400 with a second insulating material. The second insulating material may be the same as the first insulating material, but it is preferred that the second insulating material have lower filler content than the first insulating material in order to easily fill the groove 410 with the second insulating material. Further, it is preferred that the average particle size of the filler included in the second insulating material be smaller than that of the filler included in the first insulating material in order to easily fill the groove 410 with the second insulating material. The filler is a material added to an insulating material in order to impart rigidity or thermal conductivity thereto. Examples of the filler may include aluminum compounds, calcium compounds, potassium compounds, magnesium compounds, silicon compounds, and the like.

Meanwhile, in an embodiment of the present invention, since the second insulation layer 500 is sequentially formed after the formation of the first insulation layer 300, an interface which can be distinguished by surface roughness is formed between the first insulation layer 300 and the second insulation layer 500.

Figure 5A:
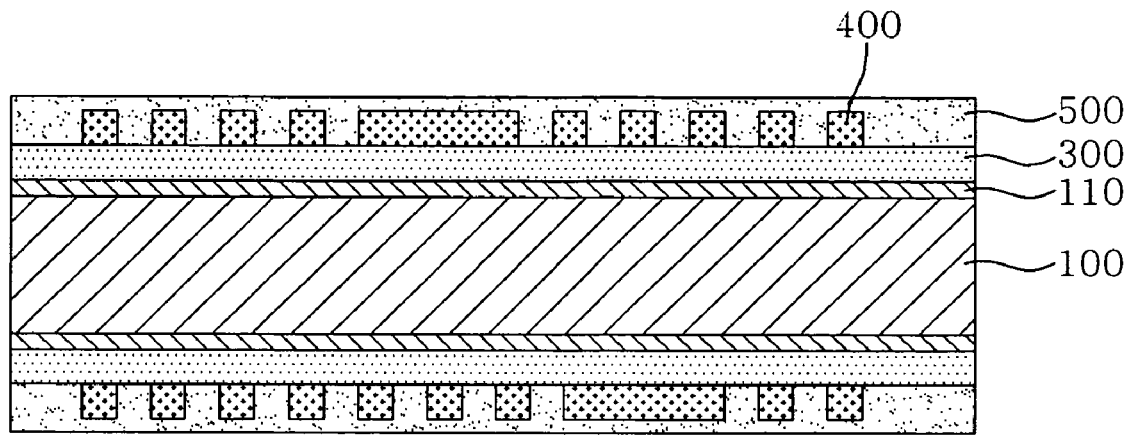

In this case, as shown in FIG. 5A, when the second insulating material is charged in the grooves 410 formed in the dry film 400, the upper surface of the dry film 400 may be covered with the second insulating material. In this case, in order to easily remove the dry film 400 in subsequent processes, the second insulating material applied on the upper surface of the dry film 400 must be removed.

Figure 5B:
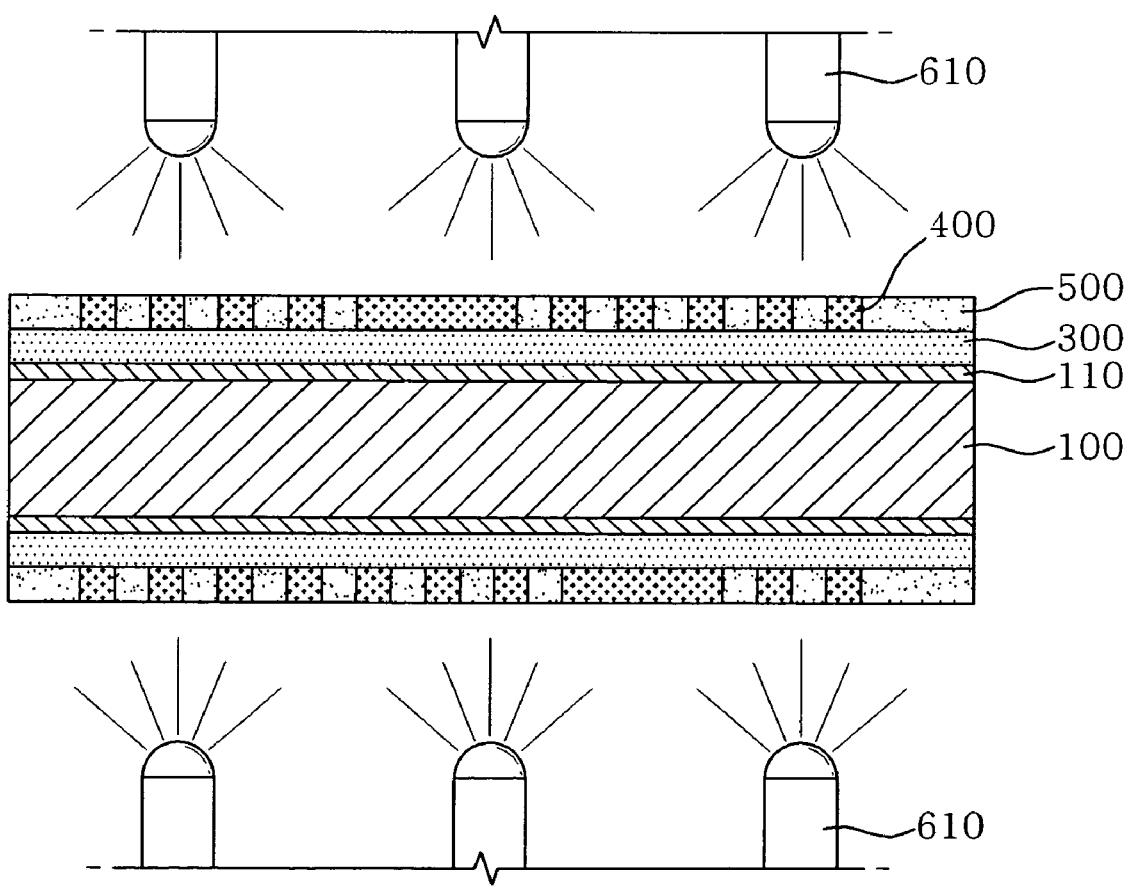
Figure 5C:
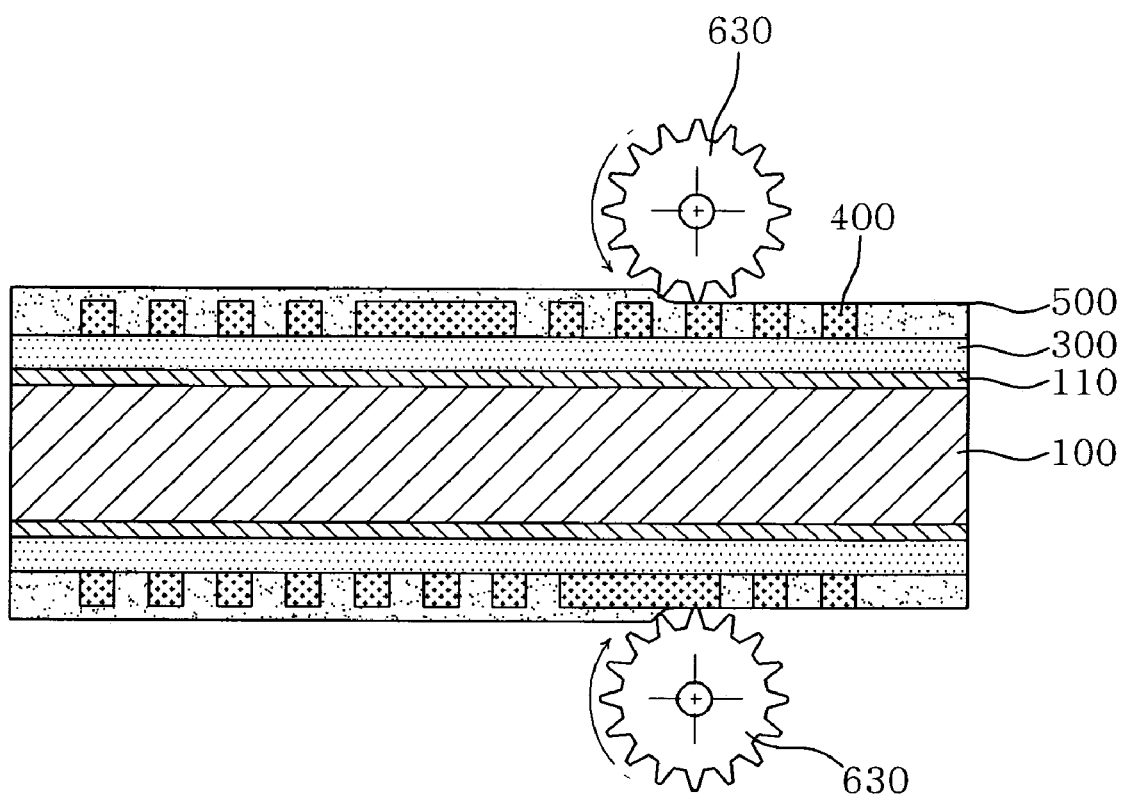

As shown in FIG. 5B, the removal of the second insulating material applied on the upper surface of the dry film 400 may be conducted by partially removing the second insulating material in its thickness direction through a dry etching process using plasma or a wet etching process (chemical etching process) using organic alkali or aqueous alkali solution supplied from etchant supply units 610. In addition, as shown in FIG. 5C, the second insulating material applied on the upper surface of the dry film 400 may be removed through a mechanical grinding process using a buff grinder 630. Moreover, although not shown, the second insulating material applied on the upper surface of the dry film 400 may be removed using a belt sander or a grinding brush.

Figure 6:
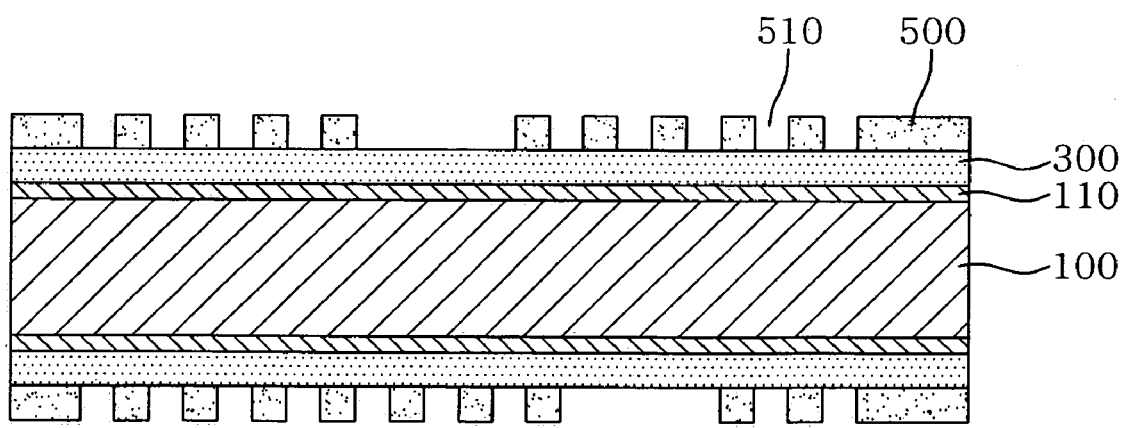

Subsequently, as shown in FIG. 6, the dry film 400 applied on the first insulation layer 300 is removed using a stripper, and thus the second insulation layer 500 having openings 510 for forming a circuit layer 900 is formed on the first insulation layer 300

Figure 7:
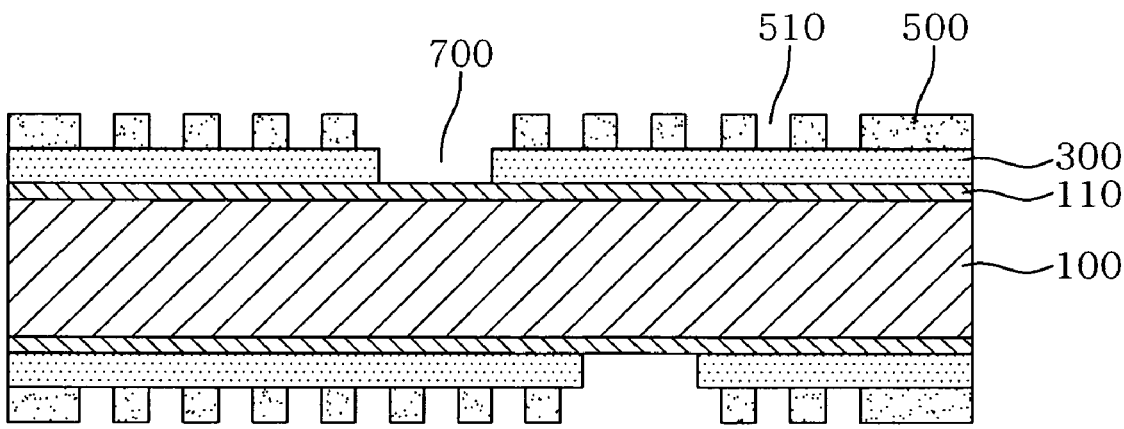

Subsequently, as shown in FIG. 7, a via hole 700 passing through the first insulation layer 300 and second insulation layer 500 is formed. In an embodiment of the present invention, the via hole 700 is formed by etching the first insulation layer 300 through the opening 510 of the second insulation layer 500, and thus the copper foil 110 applied on the insulation substrate 100 is exposed through the via hole 700. The formation of the via hole 700 may be conducted using a YAG laser drill or a $CO_2$ laser drill.

Figure 8:
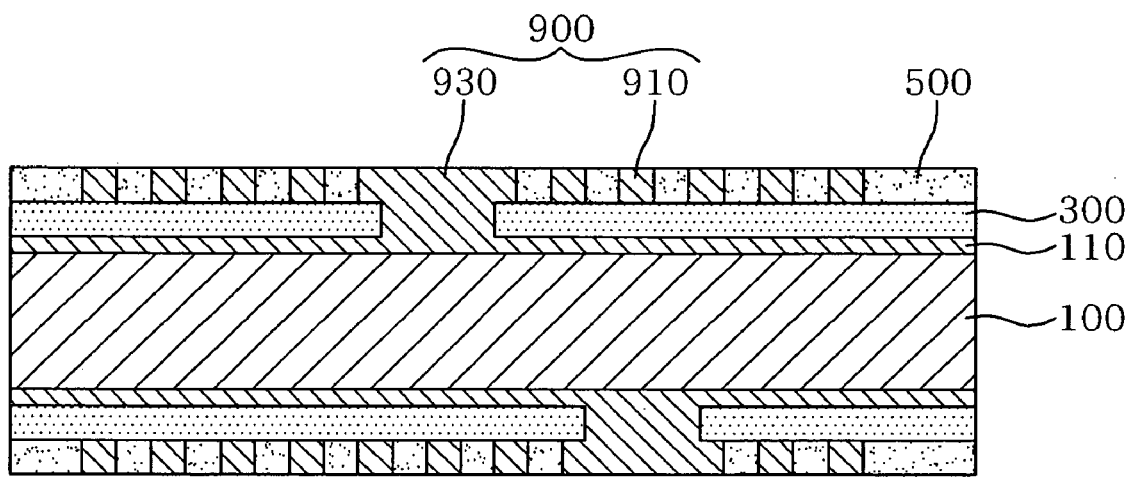

Subsequently, as shown in FIG. 8, a circuit layer 900 is formed by charging a conductive metal in the via hole 700 and openings 510. In the formation of the circuit layer 900, first, an electroless seed layer is formed on the first insulation layer 300 and second insulation layer 500, and then an electroplating layer is formed on the second insulation layer 500 by performing an electroplating process using the electroless seed layer as an incoming line. The electroless seed layer and electroplating layer may be made of a conductive metal, such as gold (Au), silver (Al), copper (Cu), nickel (Ni) or the like. Then, the electroless seed layer and electroplating layer formed on the second insulation layer 500 are removed using a buffer grinder 630, a grinding brush or a belt sander, thereby completing the circuit layer 900 including a circuit pattern 910 and a via 930.

The above-mentioned method of manufacturing a printed circuit board having a buried pattern according to an embodiment of the present invention is advantageous in that, since the openings 510 for forming the circuit pattern 910 is formed in the second insulation layer 500 using the dry film 400, the width and depth of the openings are constant compared to compared to a conventional laser trenching method, and a circuit pattern having uniform height can be formed.

Further, the above-mentioned method is advantageous in that the method is simple compared to a conventional imprinting method or laser trenching method for forming buried patterns, and thus process costs can be reduced.

Hereinafter, the structure of a printed circuit board having a buried pattern according to an embodiment of the present invention is described with reference to FIG. 8.

As shown in FIG. 8, the printed circuit board having a buried pattern according to an embodiment of the present invention includes a first insulation layer 300, a second insulation layer 500 which is formed on the first insulation layer 300 and has openings 510 for forming a circuit layer 900, and a circuit layer 900 made of a conductive metal charged in the openings 510. The printed circuit board may further include a via 930 made of a conductive metal penetrating the first insulation layer 300 and second insulation layer 500.

In this case, an interface which can be distinguished by surface roughness is formed between the first insulation layer 300 and the second insulation layer 500. This interface is necessarily formed because the first insulation layer 300 and the second insulation layer 500 are formed sequentially, not simultaneously.

Here, the first insulation layer 300 and second insulation layer 500 may be made of a filler-containing epoxy resin, a glass epoxy resin, an alumina-containing epoxy or the like, but the present invention is not limited thereto. Further, the first insulation layer 300 and second insulation layer 500 may be made of the same material as each other, and may also be made of different material from each other.

In this case, it is preferred that the first insulating material have higher filler content than the second insulating material. Further, it is preferred that the average particle size of the filler included in the first insulating material be larger than that of the filler included in the second insulating material.

The printed circuit board having a buried pattern according to an embodiment of the present invention is advantageous in that, since a circuit pattern 910 and a via 930 are buried in the second insulation layer 500, the circuit pattern 910 is not undercut, and a fine pitched circuit pattern is formed.

Further, the printed circuit board having a buried pattern according to an embodiment of the present invention is advantageous in that, since the height of the circuit pattern 910 buried in the second insulation layer 500 is uniform, its electric signal transfer performance is improved.

As describe above, a printed circuit board according to the present invention is advantageous in that, since a circuit pattern and a via are buried in an insulation layer, a circuit pattern is not undercut, and a fine pitched circuit pattern is formed.

Further, a method of manufacturing the printed circuit board according to the present invention is advantageous in that, since openings for forming circuit patterns are formed in a second insulating material using a dry film, the method is simple compared to a conventional imprinting method or laser trenching method for forming buried patterns, and thus process costs can be reduced.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a printed circuit board having a buried pattern, comprising:
    forming a second insulation layer on a first insulation layer, the second insulation layer having openings for forming a circuit layer; and
    filling the openings with a conductive metal to form a circuit layer,
    wherein the forming of the second insulation layer comprises:
    applying a dry film on the first insulation layer;
    forming grooves on the dry film such that the dry film has the same pattern as the circuit layer;
    forming the second insulating layer on the first insulating layer by filling the grooves with an insulation material; and
    removing the dry film.

2. The method according to claim 1, wherein the first insulation layer has higher filler content than the second insulation layer.

3. The method according to claim 1, further comprising:
    forming a via hole passing through the first insulation layer and the second insulation layer after the forming of the second insulation layer,
    wherein, in the filling of the openings, the via hole as well as the openings is filled with a conductive metal.

4. The method according to claim 1, wherein the dry film is a photosensitive dry film.

5. The method according to claim 1, further comprising:
    removing the insulation material applied on the dry film such that an upper surface of the dry film is exposed, after the filling the grooves with the insulation material.

6. The method according to claim 5, wherein the removing of the insulation material is conducted by a chemical etching process or a mechanical grinding process.

* * * * *